US006235631B1

United States Patent
Russell

(10) Patent No.: US 6,235,631 B1
(45) Date of Patent: May 22, 2001

(54) METHOD FOR FORMING TITANIUM ALUMINUM NITRIDE LAYERS

(76) Inventor: Noel Russell, Dallas, TX (US)

( * ) Notice: Subject to any disclaimer, the term of this patent is extended or adjusted under 35 U.S.C. 154(b) by 0 days.

(21) Appl. No.: 09/182,141

(22) Filed: Oct. 29, 1998

Related U.S. Application Data

(60) Provisional application No. 60/064,372, filed on Oct. 30, 1997.

(51) Int. Cl.$^7$ .................................................. H01L 21/44
(52) U.S. Cl. ............................ 438/674; 438/675; 438/680; 438/681
(58) Field of Search ..................................... 438/674, 675, 438/680, 681; 427/264, 255.2, 252, 253

(56) References Cited

U.S. PATENT DOCUMENTS 6,066,358 * 5/2000 Guo et al. ................................ 427/99

FOREIGN PATENT DOCUMENTS

4222021 * 1/1994 (DE).
448223 * 9/1991 (EP).

OTHER PUBLICATIONS

Sun, Y–M et al. "Low Pressure CVD Growth of AlxTil–x$^N$" Symp Chem Aspects of Electronic Ceramics Processing p. 165–70 (Abstract Only), Dec. 1997.*

Eiichi Kondoh and Tomohiro Ohta, "Chemical Vapor Deposition of Aluminum From Dimethylaluminumhydride (DMAH): Characteristics of DMAH Vaporization and Al growth Kinetics" *J. Vac. Sci. Technol. A,* vol. 13, No. 6, pp. 2863–2871, Nov./Dec. 1995.

Ajit Paranjpe and Mazhar IslamRaja, "Chemical Vapor Deposition TiN Process for Contact/Via Barrier Applications" *J. Vac. Sci. Technol. B* 13(5), pp. 2105–2113, Sep./Oct. 1995.

Sang–Hyeob Lee, Ho–Joon Ryoo and Jung–Joong Lee, "($Ti_{1-x}Al_x$) N Coatings by Plasma–Enhanced Chemical Vapor Deposition" *J. Vac. Sci. Technol. A* 12(4), pp. 1602–1607,. Jul./Aug. 1994.

Sang–Hyeob Lee and Jung–Joong Lee, "Compositionaly Gradient ($Ti_{1-x}Al_x$) N Coatings Made by Plasma Enhanced Chemical Vapor Deposition" *J. Vac. Sci. Technol.,* pp. 2030–2034.

D. McIntyre et al., "Oxidation of Metastable Single–Phase Polycrystalline $Ti_{0.5}Al_{0.5}N$ Films: Kinetics and Mechanisms" *J. Appl. Phys.* 67(3), pp. 1542–1553, Feb. 1, 1990.

L. Hultman et al., "Interfacial Reactions in Single–Crystal–TiN (100)/Al/Polycrystalline–TiN Multilayer Thin Films" *Thin Solid Films,* 215, pp. 152–161, 1992.

I. Petrov et al., "Interfacial Reactions in Epitaxial Al/$Ti_{1-x}Al_xN$(<x<0.2) Model Diffusion–Barrier Structures" *J. Vac. Sci. Technol. A* 11(1), pp. 11–17, Jan./Feb. 1993.

\* cited by examiner

Primary Examiner—Caridad Everhart

(57) ABSTRACT

A method for the chemical vapor deposition of titanium aluminum nitride layers. The method includes the steps of placing a substrate in a deposition reactor; introducing tetrakis-dimethyl-amido-titanium (TDMAT) into the reactor; and introducing dimethyl-aluminum-hydride (DMAH) into the reactor in the presence of the TDMAT. In one embodiment the TDMAT is introduced at a rate of between 10 and 1000 times the rate at which the DMAH is introduced. In another embodiment the substrate temperature is between about 200° C. and 500° C.

8 Claims, 2 Drawing Sheets

METHOD FOR FORMING TITANIUM ALUMINUM NITRIDE LAYERS

This application claims priority under 35 USC § 119 (e)(1) of provisional application Ser. No. 60/064,372, filed Oct. 30, 1997.

FIELD OF THE INVENTION

This invention generally relates to forming metal layers in semiconductor integrated circuit manufacturing, and more specifically to the chemical vapor deposition of titanium aluminum nitride.

BACKGROUND OF THE INVENTION

Increasing demand for semiconductor memory and competitive pressures require higher density integrated circuit dynamic random access memories (DRAMs) based on one-transistor, one capacitor memory cells. But scaling down capacitors with the standard silicon oxide and nitride dielectric presents problems including decreasing the quantity of charge that may be stored in a cell. Consequently, alternative dielectrics with dielectric constants greater than those of silicon oxide and nitride are being investigated. Various dielectric materials are available, such as tantalum pentoxide, lead zirconate titanate, strontium bismuth tantalate, and barium strontium titanate (BST).

These alternative dielectrics are typically deposited at elevated temperatures and in an oxidizing ambient. As a result, an oxygen-stable bottom electrode material such as platinum or ruthenium oxide is used. Platinum, however, readily forms a silicide when in direct contact with silicon, and further is not a good barrier to oxygen due to fast diffusion down the platinum grain boundaries. A typical approach to solve this problem is to deposit the platinum on a thin oxidation barrier material. One such oxidation barrier material is titanium aluminum nitride. See co-pending, co-assigned application Texas Instruments Ser. No. 09/105, 830, pending. See also Texas Instrument Ser. No. 09/105, 738 now U.S. Pat. No. 6,153,490 and Ser. No. 09/05,411 now U.S. Pat. No. 6,090, for the hardmask and etch stop features of titanium aluminum nitride, or Ti-Al-N. Note that as used herein the notation "A-B-C" indicates that the material may exist in varying compositions of the elements A, B, and C, an example being "Si-O-N". An alternative notation is "$Ti_{1-x} Al_x N$," which is used herein in some instances.

Common deposition techniques for thin films include: physical vapor deposition (PVD), sputtering for example; thermal chemical vapor deposition (CVD); and plasma-enhance chemical vapor deposition (PECVD). PVD has been used for depositing Ti-Al-N, but lacks the film thickness control and step coverage available in CVD and PECVD systems. PECVD has been investigated for Ti-Al-N deposition. See for example S.-H. Lee, et al., "$(Ti_{1-x}Al_x)N$ coatings by plasma-enhanced chemical vapor deposition," J. Vac. Sci. Technol. A 12(4), Jul/Aug 1994, p. 1602, and S.-H. Lee, et al., "Compositionally gradient (Ti1-xAlx)N coatings made by plasma enhanced chemical vapor deposition," J. Vac. Sci. Technol. A 13(4), Jul/Aug 1995, p. 2030. PECVD, however, also suffers from relatively poor step coverage, owing in large part to the directionality inherent in the electric field set up by the plasma.

Even though Ti-Al-N films produced by PVD and PECVD suffer from poor film quality and step coverage, no successful deposition of thermal CVD films has thus far been reported. The lack of a suitable precursor has been one obstacle to the implementation of CVD. The Lee papers cited above use inorganic precursors such as $TiCl_4$, $AlCl_3$, $NH_3$, $H_2$, and Ar in conjunction with PECVD for the deposition of Ti-Al-N. These precursors, however, typically require high temperatures to achieve deposition. In the Lee papers, for example, the reported substrate temperature is 450° C. Thus, a need exists in the industry for a method of forming Ti-Al-N thin films with a thermal CVD process.

SUMMARY OF THE INVENTION

In accordance with an embodiment of the invention, there is disclosed a method for the chemical vapor deposition of titanium aluminum nitride layers. The method includes the steps of placing a substrate in a deposition reactor; introducing tetrakis-dimethyl-amido-titanium (TDMAT) into the reactor; and introducing dimethyl-aluminum-hydride (DMAH) into the reactor in the presence of the TDMAT. In one embodiment the TDMAT is introduced at a rate of between 10 and 1000 times the rate at which the DMAH is introduced. In another embodiment the substrate temperature is between about 200° C. and 500° C.

An advantage of the inventive concepts is that titanium aluminum nitride films may be deposited with chemical vapor deposition. The films show good step coverage and uniform thickness.

BRIEF DESCRIPTION OF THE DRAWINGS

The foregoing features of the present invention may be more fully understood from the following detailed description, read in conjunction with the accompanying drawings, wherein.

DETAILED DESCRIPTION OF PREFERRED EMBODIMENTS

Figure 1A:
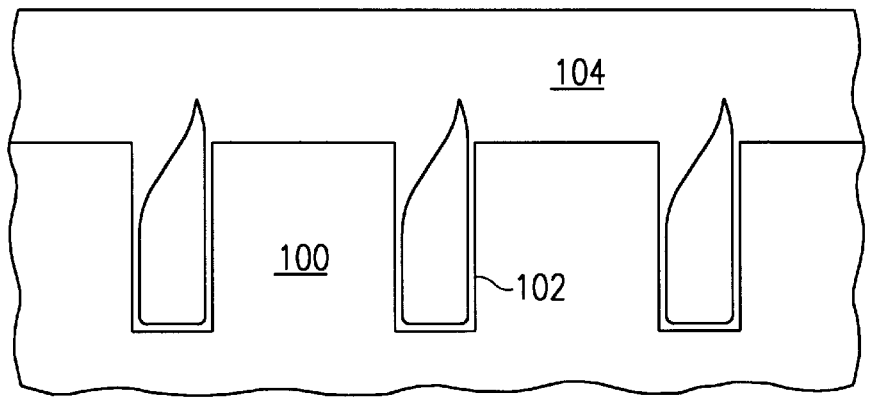
FIG. 1a is a cross-sectional diagram of a Ti-Al-N film deposited in etched silicon dioxide 0.3 um×1 um holes under the conditions described in line "A" of Table I.

In a first preferred embodiment in accordance with the invention a Ti-Al-N is formed using thermal CVD with the precursor for titanium and nitride being tetrakis-dimethyl-amido-titanium (TDMAT) and the precursor for aluminum being dimethyl-aluminum-hydride (DMAH). DMAH has been investigated previously for the deposition of aluminum. See E. Kondoh and T. Ohta, "Chemical vapor deposition of aluminum form dimethylaluminumhydride (DMAH): Characteristics of DMAH vaporization and Al growth kinetics," J. Vac. Sci. Technol. A 13(6), Nov/Dec 1995, p. 2863. TDMAT has been investigated previously for the deposition of titanium nitride. See A. Paranjpe and M. IslamRaja, "Chemical vapor deposition TiN process for contact/via barrier applications," J. Vac. Sci. Technol. B 13(5), Sep/Oct 1995, p. 2105. The use of a combination of these materials, however, has not previously been reported or suggested. The combination of organic precursors often results in gas phase interactions that produce undesirable particles and are not suitable for the deposition of thin films. Despite this, applicant has discovered that the combination of TDMAT and DMAH under proper conditions produces Ti-Al-N thin films with good step coverage and film quality.

In the first preferred embodiment in accordance with the invention, TDMAT and DMAH are flowed simultaneously into a CVD reactor. The flow rate of TDMAT is from about 10 to about 1000 times the flow rate of DMAH. The deposition substrate temperatures are from about 200° C. to about 500° C., and the resulting films comprise 1% to 50% aluminum (metals basis) and typically about 30% carbon. Note that although carbon in thin films has shown indications of enhancing the film's performance as a diffusion barrier, the effect of carbon on oxidation resistance is not yet fully understood. Techniques can be applied to decrease the amount of carbon in thin films. In one such technique the film is deposited by thermal CVD in 5 to 10 nm increments, followed by an $N_2/H_2$ plasma treatment of each layer. The $N_2/H_2$ plasma reduces the carbon content of the film from 20%–30% to about 5%. The film thickness that can be deposited in each deposition/treatment cycle is limited by the ability of the plasma-activated species to penetrate the film.

The Ti-Al-N film composition and conformality (step coverage) are dependent upon the TDMAT to DMAH flow ratios, the substrate temperature, and reactor pressures. Table I indicates that adjusting ratio of TDMAT to DMAH from 100 to 400 at low pressure and 400° C. changes the aluminum percentage of total metal in the film from 31% to 9%. The large ratio of TDMAT to DMAH that results in the desirable film compositional range is in part due to the fact that DMAH reacts at about 200° C. while TDMAT reacts at about 400° C. Thus at temperatures below 400° C. DMAH is very reactive and TDMAT decomposition limits the growth rate. In addition, the presence of carbon in the films does not change appreciably as the aluminum content increases. X-ray photoelectron spectroscopy data indicates that the aluminum in the films exists as aluminum nitride rather than metallic aluminum, and that titanium also exists as titanium nitride rather than metallic titanium. The fact that aluminum is bound to nitrogen indicates that the combination of DMAH and TDMAT produces a different result than if the chemistries where introduced separately, in which case DMAH would produce metallic aluminum on the surface.

FIG. 1a is a cross-sectional diagram of a 1 um silicon dioxide film 100 on a silicon substrate. Holes or vias 102 have been etched into the silicon dioxide. A $Ti_{0.86}Al_{0.14}N$ film 104 has been deposited under the conditions shown at line "A" in Table I. Note that the Ti-Al-N film exhibits poor step coverage and thickness control. These characteristics have been shown to improve at higher pressures and lower substrate temperatures.

Figure 3:
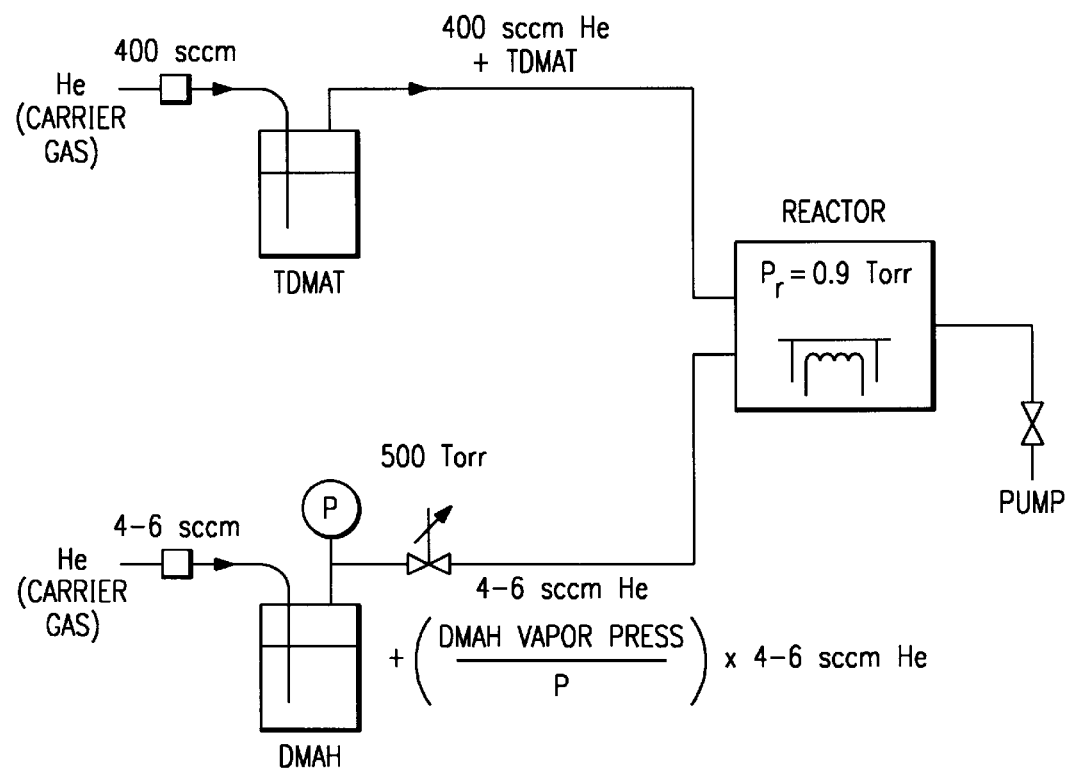
FIG. 3 is a schematic diagram of system for depositing Ti-Al-N thin films.

Table II includes data taken at three different temperatures and with gas pressures much higher than the $1\times10^{-4}$ Torr used in obtaining the data taken in Table I. A system used to produce the films described in Table II is shown in FIG. 3. In general, the data of Table II indicates that the step coverage and film thickness uniformity of the films is improved at higher pressures (on the order of 1 Torr). All three of these figures show better film thickness uniformity than did the low pressure effort shown in FIG. 1a. Pressures between 0.1 Torr and 25 Torr, the preferred value depending upon temperature and the desired growth rate, can produce desirable film thickness uniformity and step coverage.

Figure 1B:
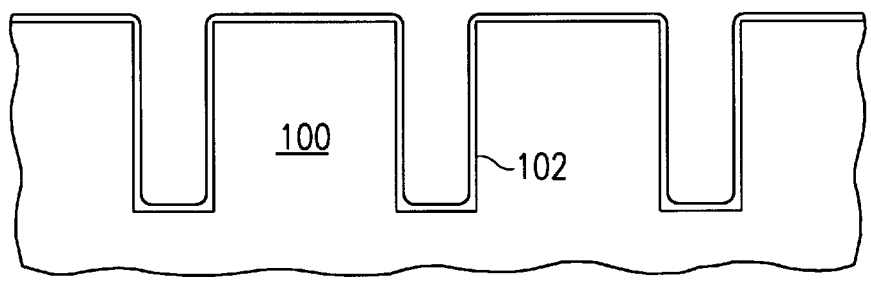
FIG. 1b is a cross-sectional diagram of a Ti-Al-N film deposited in etched silicon dioxide 0.3 um×1 um holes under the conditions described in line "B" of Table II.
Figure 1C:
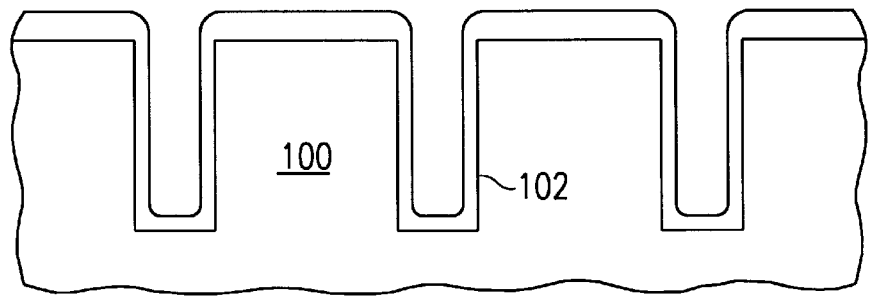
FIG. 1c is a cross-sectional diagram of a Ti-Al-N film deposited in etched silicon dioxide 0.3 um×1 um holes under the conditions described in line "C" of Table II.
Figure 1D:
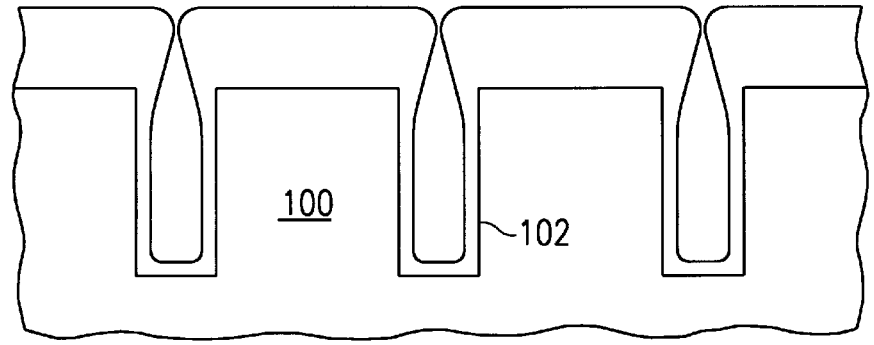
FIG. 1d is a cross-sectional diagram of a Ti-Al-N film deposited in etched silicon dioxide 0.3 um×1 um holes under the conditions described in line "D" of Table II.

Table II also indicates that the compositional structure of the film changes with temperature. Specifically, more aluminum is incorporated at higher temperatures. FIGS. 1b, 1c, and 1d, however, indicate that the step coverage and thickness control of the films is also influenced by temperature. In general, the film thickness uniformity is better at lower temperatures (FIG. 1b) than at higher temperatures (FIG. 1d).

In another embodiment in accordance with the invention, a separate source of nitrogen is added to the TDMAT and DMAH to allow independent control of the amount of nitrogen in the CVD reactor. The separate source may comprise ammonia, an amine (e.g. dimethylamine), or a hydrazine (e.g. dimethyl hydrazine). The data in Tables I and II indicate that the metal to nitrogen ratio stays relatively constant as the metal composition of the film changes. This suggests that a separate source of nitrogen may not be essential to achieving a film of good composition. Recent data, however, indicates that the carbon content of the films may be decreased by increasing the amount of nitrogen in the reactor.

Figure 2:
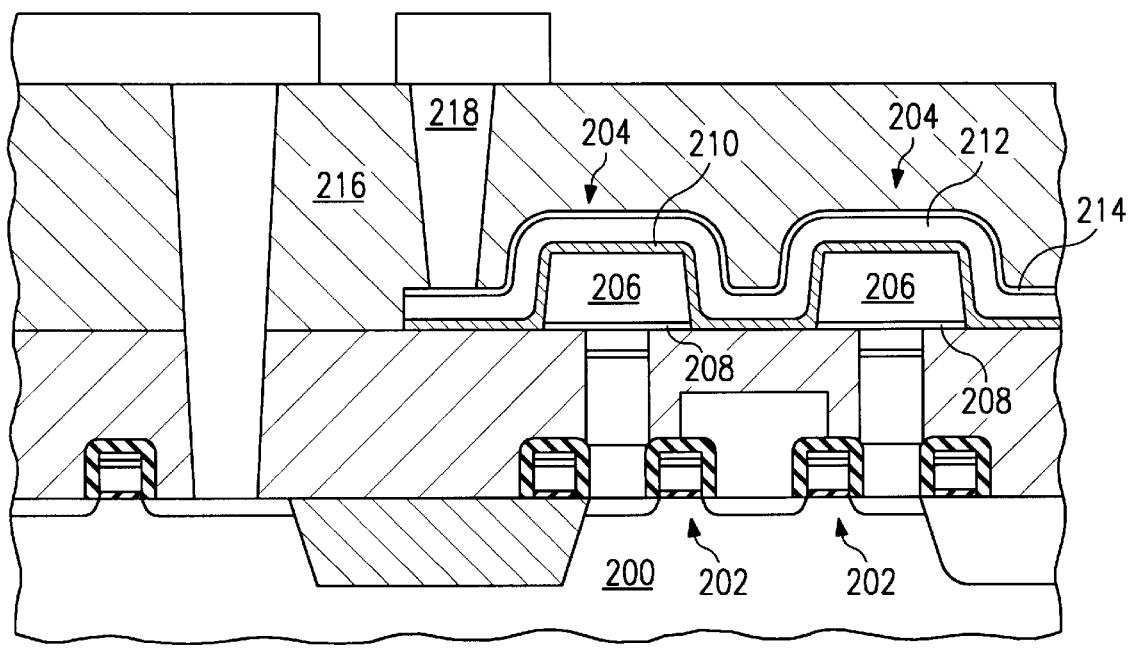
FIG. 2 is a cross-sectional diagram of two memory cells incorporating Ti-Al-N oxidation barriers and hardmask/etch stop layers formed in accordance with the inventive methods.

FIG. 2 is a cross-sectional diagram of two memory cells for a dynamic random access memory. The cells are formed on a silicon substrate 200 and include pass transistors 202 and storage capacitors 204. The capacitor bottom electrodes 206 comprise platinum, for example, and therefore benefit from the presence of a Ti-Al-N oxidation barrier 208. The oxidation barrier 208 may be deposited in accordance with the inventive deposition processes described above. The capacitor further includes a dielectric 210, barium strontium titanate for example, and a platinum top electrode 212. A Ti-Al-N hardmask 214 deposited in accordance with the inventive deposition processes described above, is deposited over the top electrode 212. Ti-Al-N layer 214 serves as a hardmask during the etching of the platinum top electrode and BST layers. Layer 214 also serves as an etch stop during the etching of interlayer dielectric 216 to form via 218.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments. The circuits and devices described herein may be implemented in silicon-based integrated circuits or in compound semiconductor integrated circuits.

TABLE I

| | TDMAT/DMAH | X(Al/Al + Ti) | % Al | % Ti | % N | % C |
|---|---|---|---|---|---|---|
| | 100 | 0.31 | 11 | 24 | 29 | 32 |
| A | 200 | 0.14 | 5 | 31 | 31 | 32 |
| | 400 | 0.09 | 3 | 32 | 32 | 33 |
| | ∞ (No DMAH) | — | — | 35 | 34 | 31 |

Reactor Pressure: $1 \times 10^{-4}$ Torr
Temperature (substrate): 400° C.

TABLE II

| | Temperature | Time | TDMAT/DMAH | % Al | % Ti | % N | % C |
|---|---|---|---|---|---|---|---|
| B | 290° C. | 180 s. | 100 | 8 | 23 | 32 | 37 |
| C | 340° C. | 120 s. | 67 | 7.5 | 21 | 34 | 38 |
| D | 390° C. | 40 s. | 67 | 24 | 16 | 26 | 35 |

Reactor Pressure: 0.9 Torr
Pressure in DMAH ampoule: 500 Torr
TDMAT carrier gas flow rate: 400 sccm

What is claimed is:

1. A method for the chemical vapor deposition of titanium aluminum nitride layers, comprising the steps of:
    placing a substrate onto which said titanium aluminum nitride layer is to be formed in a deposition reactor;
    introducing tetrakis-dimethyl-amido-titanium (TDMAT) into said reactor;
    introducing dimethyl-aluminum-hydride (DMAH) into said reactor in the presence of said TDMAT.

2. The method of claim 1, wherein said TDMAT is introduced at a rate of between 10 and 1000 times the rate of said DMAH.

3. The method of claim 2, wherein said TDMAT is introduced at a rate of between 100 and 400 times the rate of said DMAH.

4. The method of claim 1, further including the step of heating said substrate to a temperature in the range of 200° C. to 500° C.

5. The method of claim 1, further including the step of pressurizing said reactor to a pressure in the range of 0.1 to 25 Torr.

6. The method of claim 1, further including the step of introducing a separate nitrogen source into said reactor.

7. The method of claim 6, wherein said nitrogen source is ammonia.

8. The method of claim 1, further including the steps of:
    performing an $N_2/H_2$ plasma treatment on said titanium aluminum nitride layer at predetermined intervals in the formation of said film.

* * * * *